US009202924B2

(12) United States Patent
Vellaisamy et al.

(10) Patent No.: US 9,202,924 B2
(45) Date of Patent: Dec. 1, 2015

(54) RFID TAGS BASED ON SELF-ASSEMBLY NANOPARTICLES

(71) Applicant: Nano and Advanced Materials Institute Limited, Clear Water Bay, Kowloon, Hong Kong (HK)

(72) Inventors: Arul Lenus Roy Vellaisamy, Hong Kong (HK); Ye Zhou, Hong Kong (HK); Su Ting Han, Hong Kong (HK); Zong Xiang Xu, Hong Kong (HK)

(73) Assignee: NANO AND ADVANCED MATERIALS INSTITUTE LIMITED, Hong Kong (CN)

( * ) Notice: Subject to any disclaimer, the term of this patent is extended or adjusted under 35 U.S.C. 154(b) by 0 days.

(21) Appl. No.: 14/147,594

(22) Filed: Jan. 6, 2014

(65) Prior Publication Data
US 2014/0197405 A1    Jul. 17, 2014

Related U.S. Application Data

(60) Provisional application No. 61/848,773, filed on Jan. 11, 2013.

(51) Int. Cl.
*H01L 29/786* (2006.01)
*H01L 29/66* (2006.01)
*H01L 49/00* (2006.01)
*H01L 29/06* (2006.01)
(Continued)

(52) U.S. Cl.
CPC ............. *H01L 29/7869* (2013.01); *B82Y 10/00* (2013.01); *B82Y 40/00* (2013.01); *H01L 29/0665* (2013.01); *H01L 29/1033* (2013.01); *H01L 29/24* (2013.01); *H01L 29/66742* (2013.01); *H01L 29/66969* (2013.01); *H01L 29/78696* (2013.01); *H01L 49/006* (2013.01)

(58) Field of Classification Search
CPC .... B82Y 10/00; B82Y 40/00; H01L 29/7869; H01L 29/66742; H01L 29/66
USPC ........... 257/40, 43, 66; 438/99, 149, 151, 197
See application file for complete search history.

(56) References Cited

U.S. PATENT DOCUMENTS

| 6,294,401 B1 * | 9/2001 | Jacobson et al. | 438/99 |
| 7,812,342 B2 * | 10/2010 | Lee et al. | 257/40 |

(Continued)

OTHER PUBLICATIONS

V. A. L. Roy et al, "Functionalized Arylacetylene Oligomers for Organic Thin-Film Transistors (OTFTs)", Adv. Mater. 2005, 17, 1258-1261.

(Continued)

*Primary Examiner* — Nikolay Yushin
(74) *Attorney, Agent, or Firm* — Eagle IP Limited; Jacqueline C. Lui

(57) ABSTRACT

A semiconductor device comprising a gate electrode; an insulating layer in electrical connection with the gate electrode; a source electrode and a drain electrode; and a semiconducting channel layer configured to selectively allow electrically connection between the source electrode and the drain electrode based on the voltage on the gate electrode; wherein the semiconducting channel layer comprises metal nanoparticles; and the semiconducting channel layer is in contact with the source electrode, the drain electrode and the insulating layer. A method of manufacturing the semiconductor device of the present invention is also disclosed.

6 Claims, 7 Drawing Sheets

(51) Int. Cl.
  *B82Y 10/00* (2011.01)
  *B82Y 40/00* (2011.01)
  *H01L 29/10* (2006.01)
  *H01L 29/24* (2006.01)

(56) References Cited

U.S. PATENT DOCUMENTS

| | | | |
|---|---|---|---|
| 7,932,511 B2* | 4/2011 | Duan et al. | 257/9 |
| 7,976,733 B2 | 7/2011 | Chopra et al. | |
| 2005/0139867 A1* | 6/2005 | Saito et al. | 257/213 |
| 2007/0052024 A1* | 3/2007 | Lee et al. | 257/347 |
| 2010/0155696 A1* | 6/2010 | Duan et al. | 257/14 |
| 2011/0017981 A1* | 1/2011 | Bradley et al. | 257/40 |
| 2011/0236709 A1 | 9/2011 | Jablonski et al. | |
| 2012/0043124 A1* | 2/2012 | Tricoli et al. | 174/258 |
| 2013/0187154 A1* | 7/2013 | Uchiyama et al. | 257/43 |

OTHER PUBLICATIONS

V. A. L. Roy et al, "Ambipolar Charge Transport in DNA Molecules", Adv. Mater. 2008, 20, 1258-1262.

V. A. L. Roy et al, "Controlled Self-Assembly of Functional Metal Octaethylporphyrin 1D Nanowires by Solution-Phase Precipitative Method", Chem Asian J. 2008, 3, 1968-1978.

Jorg J. Schneider et al, "A Printed and Flexible Field-Effect Transistor Device with Nanoscale Zinc Oxide as Active Semiconductor Material", Adv. Mater. 2008, 20, 3383-3387.

Heng Pan et al, "Melt-mediated coalescence of solution-deposited ZnO nanoparticles by excimer laser annealing for thin-film transistor fabrication", Appl Phys A (2009) 94: 111-115.

Wei Lu et al, "Self-assembled nanostructures with tridentate cyclometalated platinum(II) complexes", Chem. Commun., 2006, 3972-3974.

Dongjo Kim et al, "Inkjet-Printed Zinc Tin Oxide Thin-Film Transistor", Langmuir 2009, 25(18), 11149-11154.

Hui Wu et al, "Fabrication, assembly and electrical characterization of CuO nanofibers", Applied Physics Letters 89, 133125(2006); doi: 10.1063/1.2355474.

Zong-Xiang Xu et al, "Nanocomposite field effect transistors based on zinc oxide/polymer blends", Applied Physics Letters 90, 223509 (2007); doi: 10.1063/1.2740478.

M. A. Mangold et al, "Surface Plasmon enhanced photoconductance of gold nanoparticle arrays with incorporated alkane linkers", Applied Physics Letters 94, 161104 (2009).

Zong-Xiang Xu et al, "Organic field-effect transistors fabricated with N, N-substituted dialkyl-1, 3, 8, 10-tetramethylquinacridone compounds", Applied Physics Letters 95, 123305 (2009).

Chi-Ming Che et al, "A high-performance organic field-effect transistor based on Platinum(II) Porphyrin: Peripheral Substituents on Porphyrin ligand significantly affect film structure and charge mobility", Chem Asian J. 2008, 3, 1092-1103.

Peter Stallinga et al, "Metal-Insulator-Metal Transistors", Adv. Mater. 20, 2120-2124 (2008), "http://www.natureasia.com/asia-materials/highlight.php?id=230".

* cited by examiner

RFID TAGS BASED ON SELF-ASSEMBLY NANOPARTICLES

CROSS-REFERENCE TO RELATED APPLICATION

This application claims benefit under 35 U.S.C. §119(e) of U.S. Provisional Application having Ser. No. 61/848,773 filed 11 Jan. 2013, which is hereby incorporated by reference herein in its entirety.

FIELD OF INVENTION

This invention relates to a semiconductor device such as thin-film transistor and a manufacturing method thereof.

BACKGROUND OF INVENTION

Conventionally, silicon has been used as a major ingredient for making semiconductor devices including transistors. The unique semiconducting property of silicon has been relied on in making semiconductor devices. However, the current silicon-based manufacturing techniques are expensive and incomparable to form semiconductor devices on many flexible substrates, for example on plastic materials. This is because some of the conventional manufacturing steps involve high temperature, which tends to melt the flexible substrates. Forming semiconductor devices on flexible substrates can significantly enhance and broaden the function of the semiconductor devices; therefore, it is highly commercially attractive to manufacture semiconductor devices on flexible substrates.

SUMMARY OF INVENTION

In the light of the foregoing background, it is an object of the present invention to provide an alternate semiconductor device and a method of manufacturing thereof.

Accordingly, the present invention in one aspect is a semiconductor device comprising a gate electrode; an insulating layer in electrical connection with the gate electrode; a source electrode and a drain electrode; and a semiconducting channel layer configured to selectively allow electrically connection between the source electrode and the drain electrode based on the voltage on the gate electrode; wherein the semiconducting channel layer comprises metal nanoparticles; and the semiconducting channel layer is in contact with the source electrode, the drain electrode and the insulating layer.

In one embodiment, the semiconductor device has a hole mobility greater than about 20 cm$^2$ V$^{-1}$ s$^{-1}$.

In another embodiment, the semiconductor device has an electron mobility greater than about 18 cm$^2$/Vs.

In yet another embodiment, the metal nanoparticles are selected from a group consisting of Au, Ag, Pd, Pt and any combinations thereof.

In further another embodiment, the semiconducting channel layer further comprises metal oxide nanoparticles.

In another embodiment, the metal oxide nanoparticles are selected from a group of ZnO and CuO.

In another embodiment, the semiconducting channel layer is in a form of nanostructure.

In another embodiment, the semiconducting channel layer has a thickness in a range of 5-20 nm.

In another embodiment, the semiconductor device is a thin film transistor of an inverter used in a ring oscillator of an RFID tag.

According to another aspect of the present invention, a method of manufacturing a semiconductor device is provided comprising the steps of providing a nanoparticle solution comprising nanoparticles; allowing the nanoparticles to undergo self-assembly into an array of nanoparticles; forming the array of nanoparticles onto a substrate to form a semiconducting channel layer; and forming source and drain electrodes in contact with the semiconducting channel layer.

In one embodiment, the metal nanoparticles are selected from the group consisting of Au, Ag, Pd, Pt and any combinations thereof.

In another embodiment, the nanoparticle solution further comprises metal oxide nanoparticles.

In yet another embodiment, the metal oxide nanoparticles are selected from a group consisting of ZnO and CuO.

In another embodiment, the semiconducting channel layer has a thickness in a range of 5-20 nm.

In another embodiment, the substrate is immersed in the nanoparticle solution in a range of 1-3 hours.

One of the advantages of the present invention is to provide a semiconductor device that can be manufactured at low cost and operated at low power consumption. The low manufacture cost can be achieved by using solution-processed method at low temperature (less than 100 degree Celsius). In another advantage, the solution processed method, in one embodiment, prints the semiconducting channel layer by using the nanoparticle solution containing metal nanoparticles on the various substrates. The metal nanoparticles of the present invention are highly stable in the atmosphere compared to other conventional printable semiconductors. Another advantage of the present invention is that the semiconductor device can be easily to be scaled down.

These and other objects, features, aspects and advantages of the present invention will become more apparent from the following detailed description of the present invention when taken in conjunction with the accompanying drawings.

DETAILED DESCRIPTION OF THE PREFERRED EMBODIMENTS

As used herein and in the claims, "comprising" means including the following elements but not excluding others.

Figure 1:
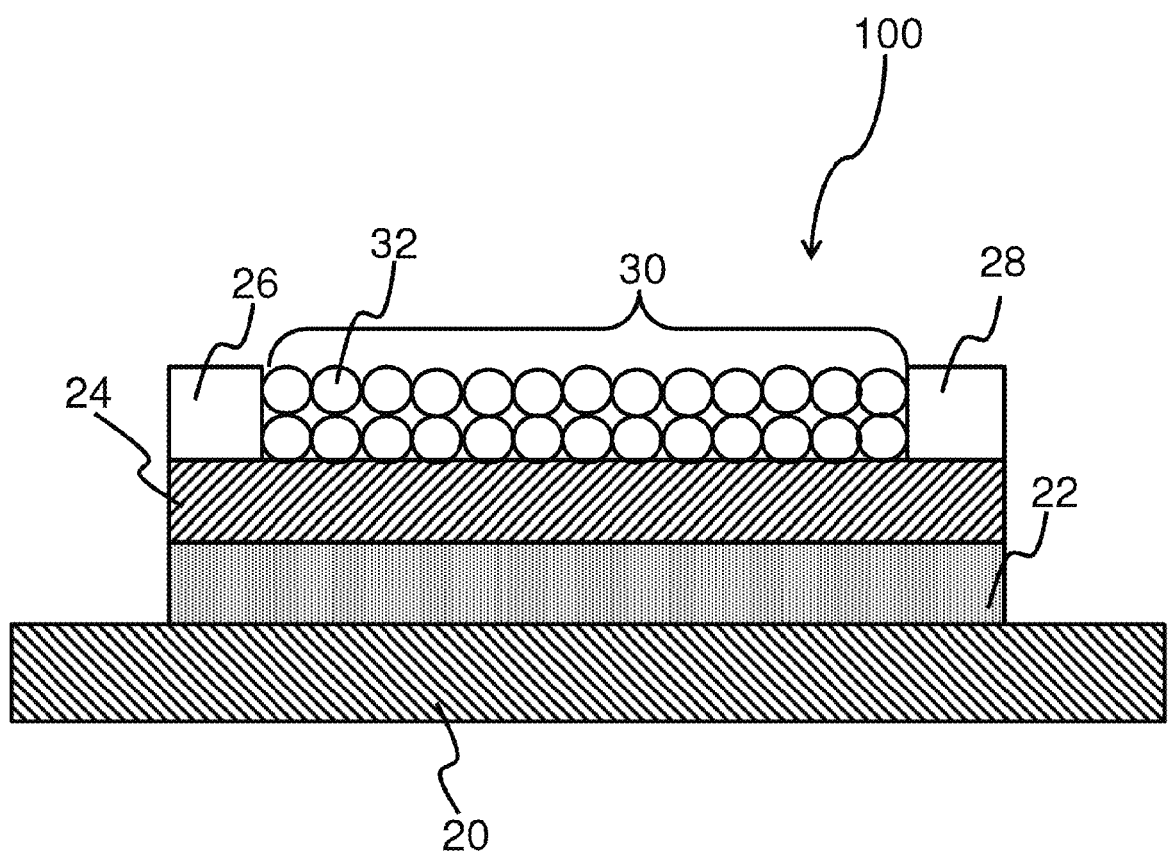
FIG. 1 is a cross sectional diagram of a semiconductor device 100 according to one embodiment of the present invention, illustrating the key structures thereof.

FIG. 1 is a cross sectional diagram of a semiconductor device 100 according to one embodiment of the present invention where the key structures the semiconductor device 100 are illustrated. For instance, the semiconductor device 100 comprises a substrate 20, which is made of silicon in one exemplary embodiment; a gate electrode 22 disposed on the substrate 20; and an insulating layer 24 stacked on top of the gate electrode 22. In another embodiment, the substrate is made of polyethylene terephthalate (PET), polyethylene naphthalene (PEN) or any plastic substrates. The insulating layer 24 has a layer thickness in a range of 20 to 200 nm and is made of polymer dielectrics and metal oxide in one exemplary embodiment. The semiconductor device 100 also comprises a source electrode 26 and a drain electrode 28 disposed on the insulating layer 24. In one exemplary embodiment, the electrodes 26, 28 are made of gold (Au) or silver (Ag). A semiconducting channel layer 30 is disposed on the insulating layer 24. In one embodiment, the source electrode 26 and the drain electrode 28 are disposed on the semiconducting channel layer 30 such that an electrical connection can be achieved between the source electrode 26 and the drain electrode 28. In yet a further embodiment, the semiconducting channel layer 30 is disposed between the source electrode 26 and the drain electrode 28 such that an electrical connection can be achieved between the source electrode 26 and the drain electrode 28. By varying the voltage at the gate electrode 22 (i.e. the gate voltage), the semiconducting channel layer 30 selectively allows and/or adjusts electrical connection between the source electrode 26 and the drain electrode 28.

In one embodiment, the semiconducting channel layer 30 comprises a nanostructure of array of colloidal nanoparticles 32 (array of nanoparticles 32). The nanostructure provides either p-type or n-type transport properties depending on the material used as the nanoparticles. The charge carriers of the semiconducting channel layer 30 are adapted to have motilities sufficient enough to make sure that charge induced in the semiconducting channel layer 30 can actually contribute to the current. Preferably, the semiconducting channel layer 30 has a hole mobility greater than about 20 cm$^2$ V$^{-1}$ s$^{-1}$ and an electron mobility greater than about 18 cm$^2$/Vs. More preferably, the hole mobility is in a range of 20 cm$^2$ V$^{-1}$ s$^{-1}$-125 cm$^2$ V$^{-1}$ s$^{-1}$ and the electron mobility is in a range of 18 cm$^2$/V-100 cm$^2$/Vs. According to one embodiment of the present invention, the material used as the nanoparticles are metal. In one further embodiment, the nanoparticles are selected from a group consisting of gold (Au), silver (Ag), palladium (Pd), platinum (Pt) and any combinations thereof. In yet another embodiment, other materials can also be used for the semiconductor channel layer 30 as long as that material has the energetic band gap narrower than that of the insulating layer 22. In another embodiment of the present invention, the nanoparticles are a combination of metal nanoparticles and metal oxide nanoparticles. In another further embodiment of the present invention, the metal nanoparticles of the combination of metal nanoparticles and metal oxide nanoparticles are selected from a group consisting of gold (Au), silver (Ag), palladium (Pd), platinum (Pt) and any combinations thereof. The metal oxide nanoparticles are selected from a group consisting of ZnO and CuO.

The thickness of the semiconducting channel layer 30 according to one embodiment of the present invention is in range of 5 nm to 20 nm. In another embodiment, the array of nanoparticles 32 is monolayer. The semiconducting channel layer 30 with free charge carriers has to be as thin as possible to prevent parallel conductance. In another embodiment, the semiconducting channel layer 30 is a monolayer of nanoparticles. In yet another embodiment, if the semiconducting channel layer 30 has no free charge carriers, there is no limitation on the thickness of the semiconducting channel layer 30. Such kind of semiconducting channel layer 30 can be made by metal nanoparticles such as Au, Ag, and Pt.

Figure 2:
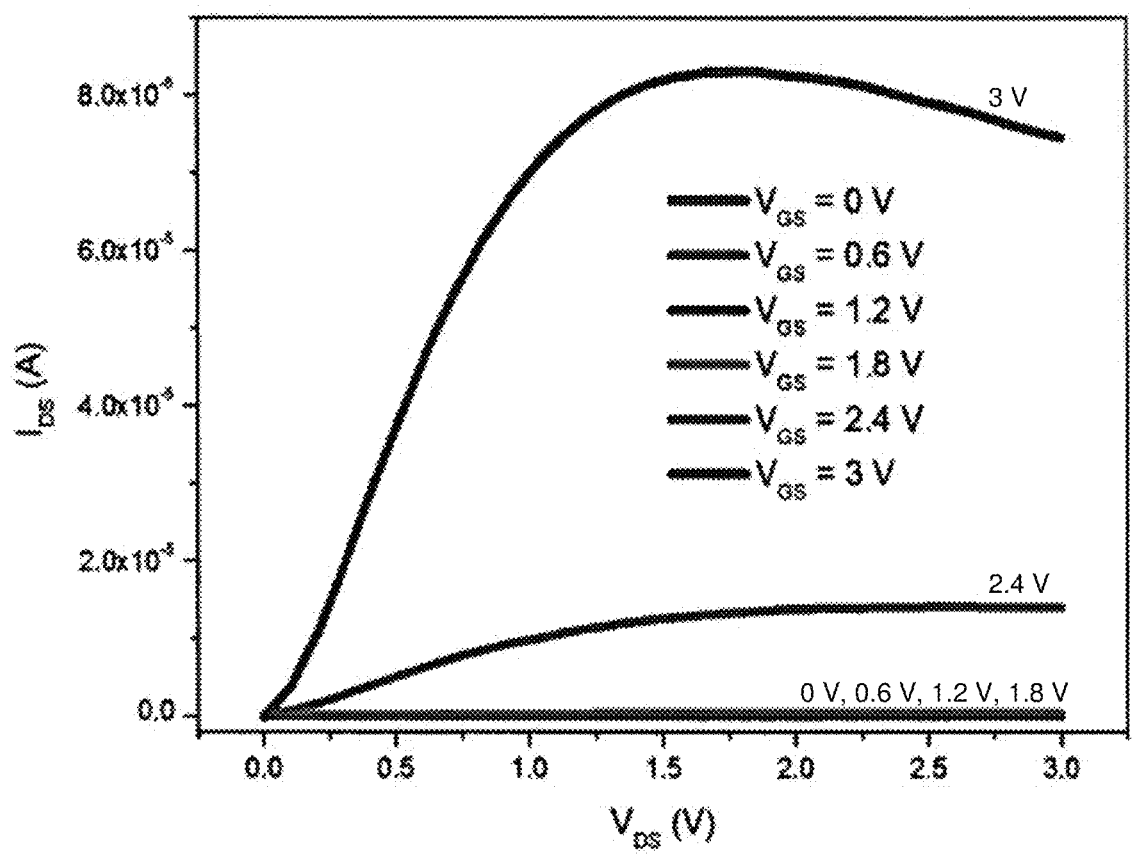
FIG. 2 shows the drain current-voltage diagram of a semiconductor device with metal nanoparticles as the material of the n-type semiconducting channel layer according to one exemplary embodiment of the present invention.
Figure 3:
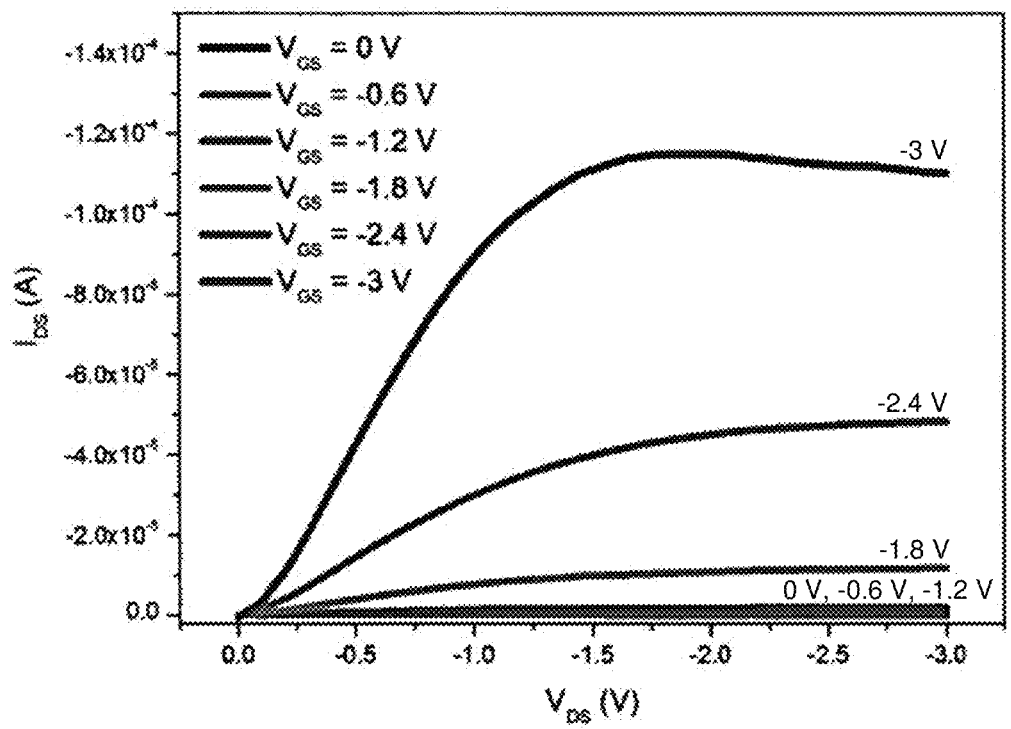
FIG. 3 shows the drain current-voltage diagram of a semiconductor device with metal nanoparticles as the material of the p-type semiconducting channel layer according to one exemplary embodiment of the present invention.

Now turning to the key operation of the semiconductor device 100. The electrical resistance of the semiconducting channel layer 30 of the semiconductor device 100 of the present invention changes respectively with the change of gate voltage. In one embodiment, the semiconducting channel layer 30 is made of materials other than semiconductor; in a further embodiment, the materials are metal nanoparticles or a combination of metal nanoparticles and metal oxide nanoparticles. FIGS. 2 and 3 show the drain current-voltage curves of the semiconductor device 100 at different gate voltages, where metal nanoparticles are used as the material of the n-type semiconducting channel layer 30 and p-type semiconducting channel layer 30 according to one exemplary embodiment of the present invention respectively.

In FIG. 2, the n-type semiconducting channel layer 30 with metal nanoparticles allows and/or adjusts electrical connection between the source electrode 26 and the drain electrode 28 as the gate voltage increases. In contrast, when the gate voltage decreases to zero, the n-type semiconducting channel layer 30 with metal nanoparticles blocks the electric connection between the source electrode 26 and the drain electrode 28.

In FIG. 3, the p-type semiconducting channel layer 30 with metal nanoparticles allows and/or adjusts electrical connection between the source electrode 26 and the drain electrode 28 when the gate voltage is below zero. In contrast, when the gate voltage increases to zero, the p-type semiconducting channel layer 30 with metal nanoparticles blocks the electric connection between the source electrode 26 and the drain electrode 28. Preferably, the gate bias for the n-type semiconducting channel layer 30 and the p-type semiconducting channel layer 30 of the present invention are 3 V and −3V respectively.

Figure 4:
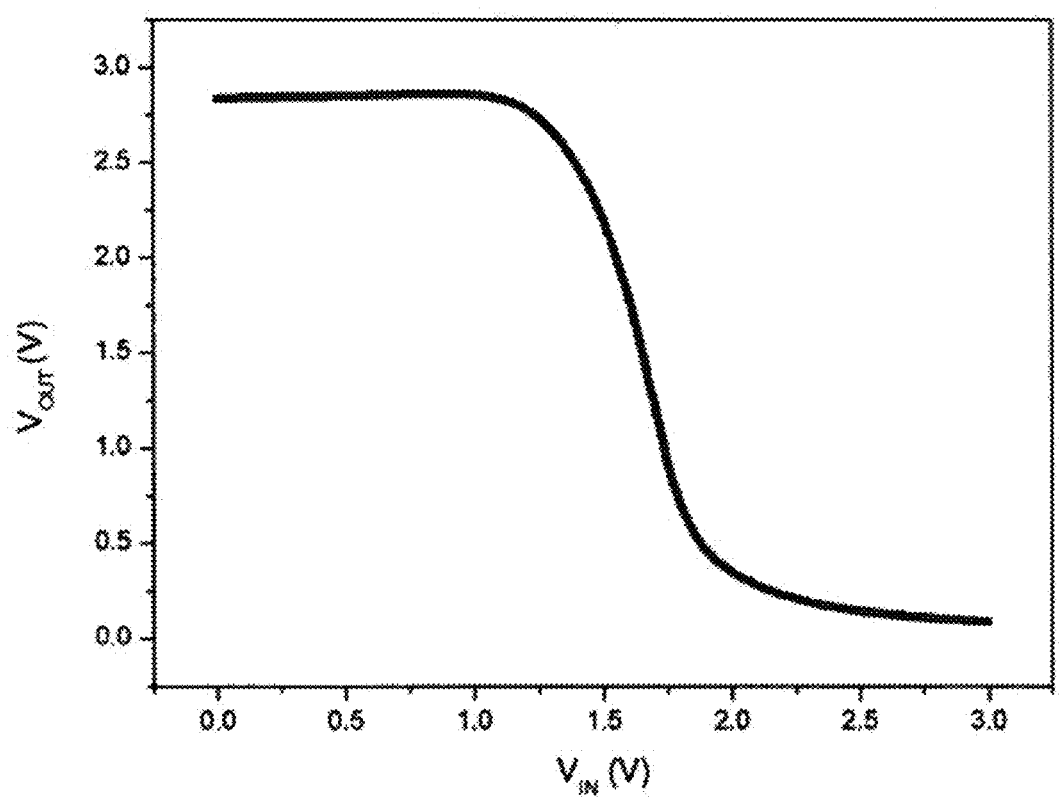
FIG. 4 shows the input voltage-output voltage diagram of the inverter using the Thin-Film Transistor (TFT) according to one exemplary embodiment of the present invention.
Figure 5:
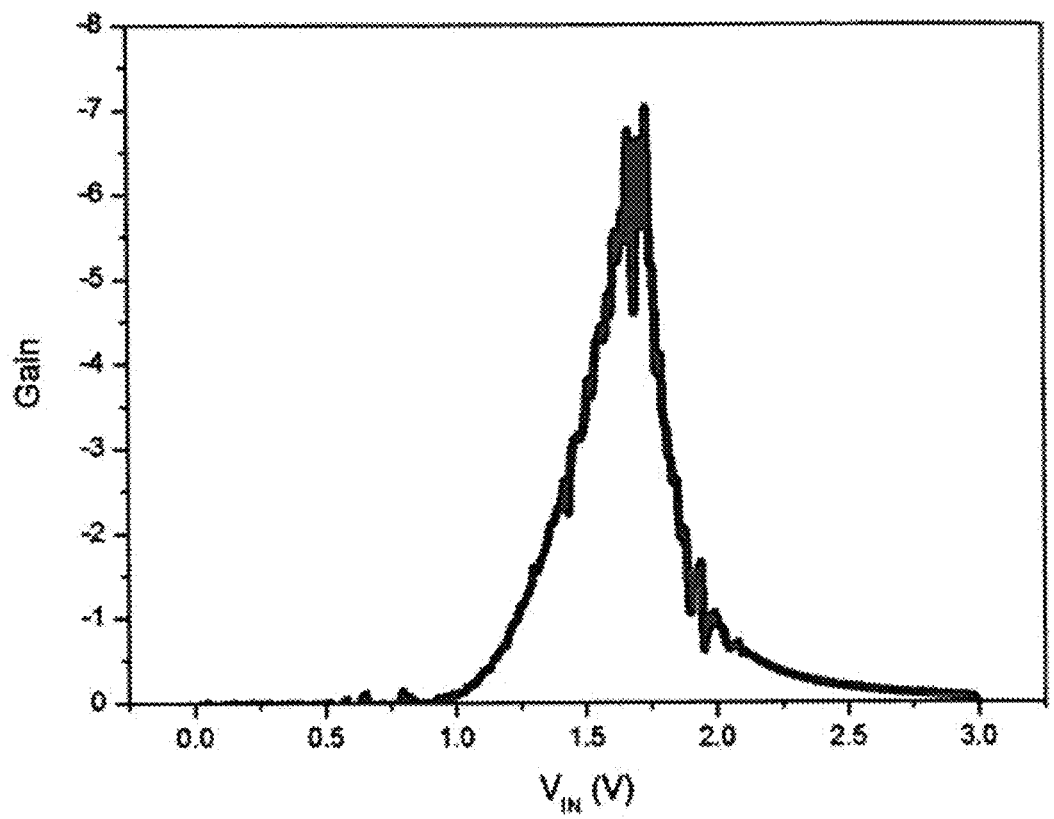
FIG. 5 shows the gain diagram of the inverter according to one exemplary embodiment of the present invention.
Figure 6:
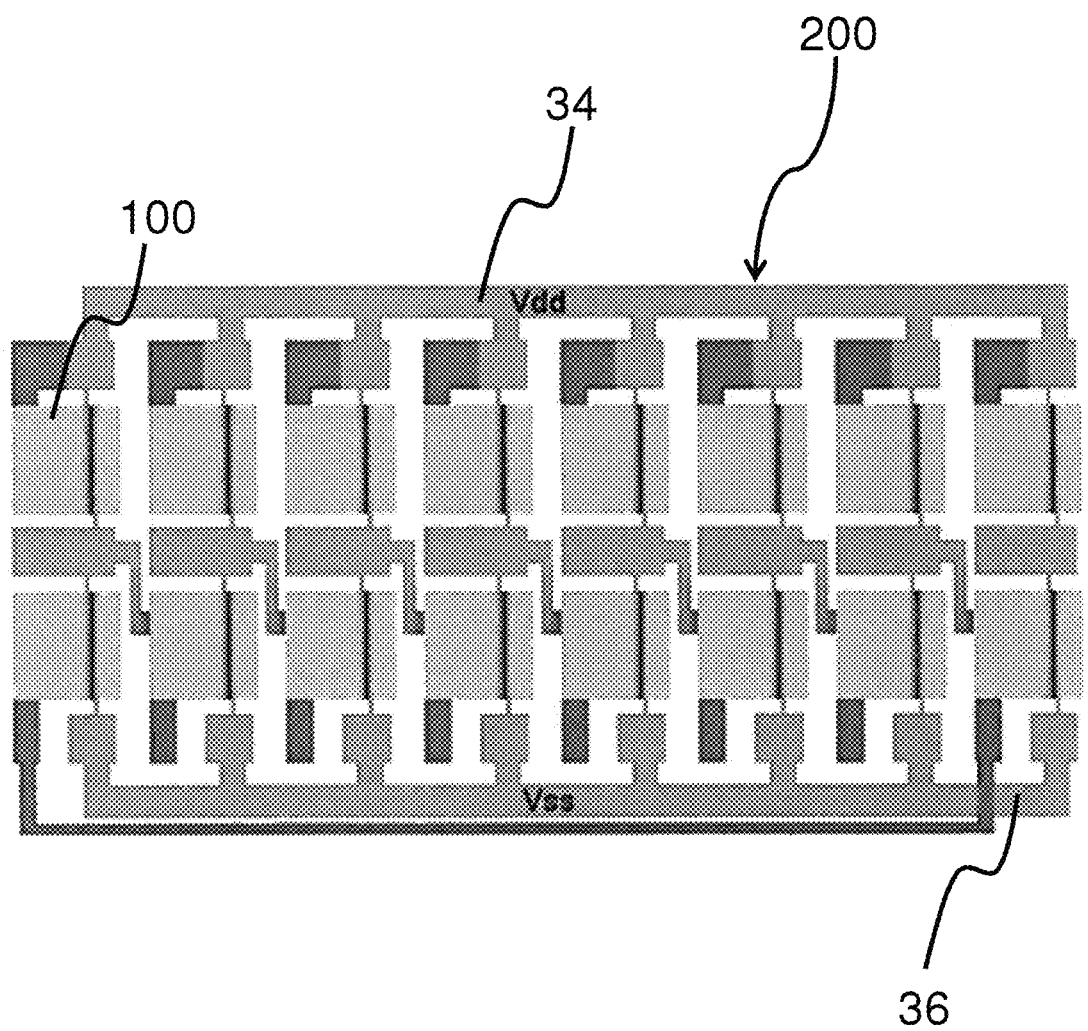
FIG. 6 illustrates the nanoparticle based ring oscillator used in RFID tag according to one exemplary embodiment the present invention.

The semiconductor device 100 of the present invention in one embodiment is a Thin Film Transistor (TFT). In another embodiment of the present invention, the semiconductor device 100 is a TFT part of an inverter used in a ring oscillator of an RFID tag with various frequencies, including frequencies of 13.56 MHz and 13.54 MHz. FIG. 4 shows the input voltage-output voltage diagram of the inverter using the TFT according to one exemplary embodiment of the present invention. As shown in FIG. 4, the output voltage is about 3.0V when the input voltage is about 0V and vice versa. FIG. 5 shows the gain of the inverter according to one exemplary embodiment of the present invention. It shows that the inverter has a peak gain when source voltage is about 1.5V. FIG. 6 illustrates the nanoparticle based ring oscillator 200 used in RFID tag according to one exemplary embodiment the present invention. The ring oscillator 200 comprises the semiconductor device 100, a power electrode 34 and ground electrode 36. The power electrode 34 and ground electrode 36 are connected to the semiconductor device 100.

Figure 7:
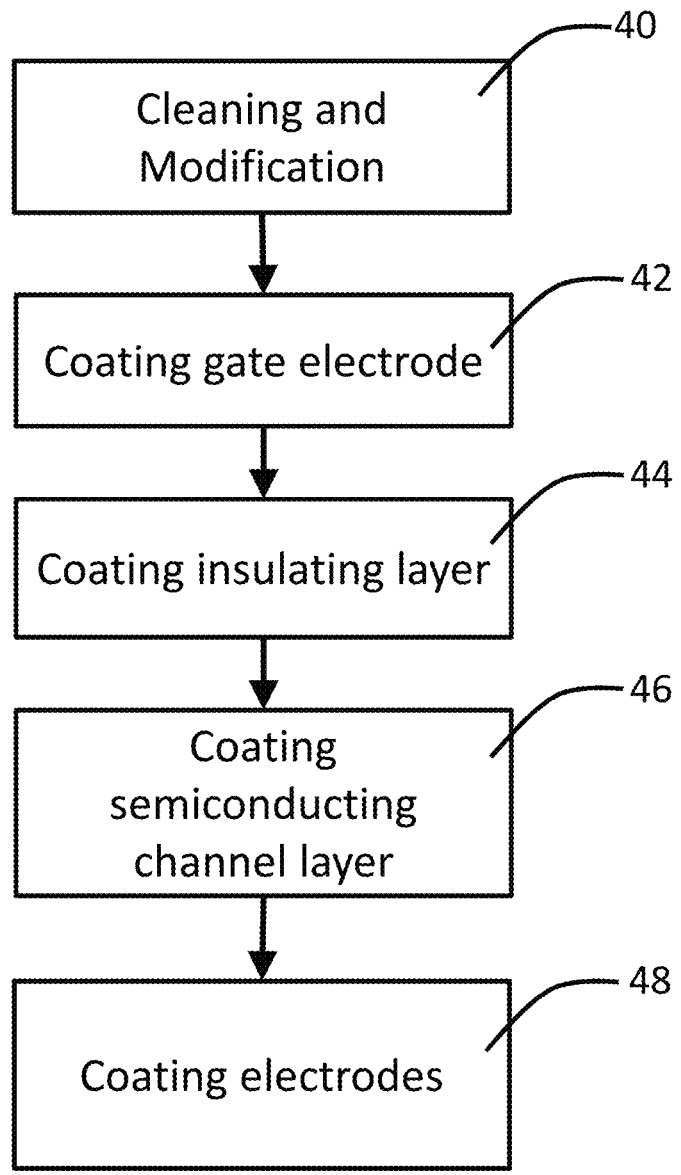
FIG. 7 illustrates a sequence of steps in a method of manufacturing a semiconductor device of the present invention.

FIG. 7 illustrates a sequence of steps in a method of manufacturing a semiconductor device 100 of the present invention. The semiconductor device 100 is formed by a solution process. Firstly, a substrate 20 is ultrasonically cleaned using various solvents, for example, DI-water, acetone and 2-propanol and modified by using (3-aminopropyl)triethoxysilane or (3-aminopropyl)-trimethoxysilane in step 40. After that, in step 42, the substrate 20 is coated by the gate electrode 22. Upon the coating of the gate electrode 22, the insulating layer 24 is coated on top of the gate electrode 22. The insulating layer is deposited as the gate dielectric using a Savannah 100

ALD system at a substrate temperature of 80° C. in step 44. Thereafter, in step 46, the semiconducting channel layer 30 is formed on the insulating layer 24 by coating the array of nanoparticles on the substrate 20. The followings are two exemplary embodiments for the methods of coating the array of nanoparticles on the substrate 20.

First Embodiment

In the first embodiment, the array of nanoparticles 32 is formed by first immersing the substrate 20 into a nanoparticle solution, which comprises nanoparticles 32 to be coated on the substrate 20, for 1-3 hours. In one embodiment, the substrate 20 is immersed into the nanoparticle solution for 2 hours. The nanoparticles 32 in the nanoparticle solution undergo self-assembly to form the array of nanoparticles 32 while the substrate 20 is immersed in the nanoparticle solution. The array of nanoparticles 32 is formed directly onto the substrate 20 during the immersing step. In one embodiment, the nanoparticles 32 undergo self-assembly (i.e. the substrate 20 is immersed into the nanoparticle solution) in a glove box in order to prevent the contamination of $O_2$ and $H_2O$. After the immersing step, the substrate 20 coated with the array of nanoparticles 32 is dried by completely evaporating the residual nanoparticle solution left on the substrate.

The Second Embodiment

In the second embodiment, the nanoparticle solution is put in a container and the nanoparticles 32 in the nanoparticle solution are allowed to undergo self-assembly to form a 2D self-assembled nanoparticles monolayer on the surface of the nanoparticle solution. In one embodiment, the self-assembly is performed in a glove box in order to prevent the contamination of $O_2$ and $H_2O$. After complete evaporation of solvent, which is used to disperse the nanoparticles, the 2D self-assembled array of nanoparticles 32 is first lifted from solution surface using PDMS pad by Langmuir-Schaefer deposition method and then the PDMS pad is brought into conformal contact with the substrate 20 for about 10 seconds. Fabrication of such well-ordered array of nanoparticles 32 is easy to transfer intact to both hydrophobic and hydrophilic substrates 20.

After step 46, the source electrode 26 and the drain electrode 28 are formed through a shadow mask on the semiconductor device 100 in step 48. The source and drain electrodes 26, 28 are formed as described in the second paragraph of this section.

In one embodiment of the present invention, the above mentioned manufacturing steps are used in making a TFT. In another embodiment, the above mentioned manufacturing steps are used in making a TFT of an inverter of a ring oscillator of during a process of manufacturing an RFID tag with various frequencies, including frequencies of 13.56 MHz and 13.54 MHz.

The following are examples showing how to prepare nanoparticle solution for gold (Au), silver (Ag) and palladium (Pd):

Au nanoparticles were prepared by the reduction of $HAuCl_4 \cdot 3H_2O$ in the presence of $Na_3Ct$ in ice-cold environment.

Ag nanoparticles were prepared by mixing $AgNO_3$, sodium citrate and $NaBH_4$.

Pd nanoparticles were synthesized by mixing $H_2PdCl_4$, L-ascorbic acid and PVP at 100° C.

The following table shows the hole mobility and electron mobility for the semiconductor device with semiconductor channel layer using nanoparticles of gold (Au), silver (Ag) and palladium (Pd).

TABLE 1

|  | Au nanoparticles | Ag nanoparticles | Pd nanoparticles |
|---|---|---|---|
| Hole mobility | 125 $cm^2/Vs$ | 20 $cm^2/Vs$ | 26 $cm^2/Vs$ |
| Electron mobility | 91 $cm^2/Vs$ | 18 $cm^2/Vs$ | 19 $cm^2/Vs$ |

Platinum (Pt) nanoparticles were prepared by the reduction of Pt (IV) salt in the presence of $Na_3Ct$ at room temperature.

The exemplary embodiments of the present invention are thus fully described. Although the description referred to particular embodiments, it will be clear to one skilled in the art that the present invention may be practiced with variation of these specific details. Hence this invention should not be construed as limited to the embodiments set forth herein.

What is claimed is:

1. A semiconductor device comprising
   a) a gate electrode;
   b) an insulating layer in electrical connection with said gate electrode;
   c) a source electrode and a drain electrode; and
   d) a semiconducting channel layer configured to selectively allow electrically connection between said source electrode and said drain electrode based on the voltage on said gate electrode;
   wherein said semiconducting channel layer comprises metal nanoparticles and metal oxide nanoparticles; wherein said semiconducting channel layer is in contact with said source electrode, said drain electrode and said insulating layer; and wherein said metal nanoparticles are selected from a group consisting of Au, Ag, Pd, Pt and any combinations thereof and said metal oxide nanoparticles are selected from a group of ZnO and CuO; wherein said metal nanoparticles and said metal oxide nanoparticles form an array of self-assembly nanostructure; wherein said array of self-assembly nanostructure forms a monolayer.

2. The semiconductor device according to claim 1, wherein said semiconductor device is a thin film transistor of an inverter used in a ring oscillator of an RFID tag.

3. A method of manufacturing a semiconductor device comprising the steps of:
   a) providing a nanoparticle solution comprising metal nanoparticles and metal oxide nanoparticles;
   b) allowing said nanoparticles to undergo self-assembly to form a 2D self-assembled nanoparticles monolayer on said nanoparticle solution;
   c) forming said array of nanoparticles onto a substrate to form a semiconducting channel layer; and
   d) forming source and drain electrodes in contact with said semiconducting channel layer;
   wherein said metal nanoparticles are selected from the group consisting of Au, Ag, Pd, Pt and any combinations thereof; and wherein said metal oxide nanoparticles are selected from a group consisting of ZnO and CuO.

4. The semiconductor device of claim 1, wherein said metal oxide nanoparticles are CuO.

5. The method of manufacturing a semiconductor device of claim 3, wherein said metal oxide nanoparticles are CuO.

6. The method of manufacturing a semiconductor device of claim 3 further comprises the step of preparing a nanoparticle solution comprising $H_2PdCl_4$, L-ascorbic acid and PVP.

\* \* \* \* \*